United States Patent
Saiki et al.

(10) Patent No.: US 6,555,757 B2
(45) Date of Patent: Apr. 29, 2003

(54) PIN SOLDER JOINTED TO A RESIN SUBSTRATE, MADE HAVING A PREDETERMINED HARDNESS AND DIMENSIONS

(75) Inventors: Hajime Saiki, Aichi (JP); Noritaka Miyamoto, Kasugai (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 78 days.

(21) Appl. No.: 09/829,441

(22) Filed: Apr. 10, 2001

(65) Prior Publication Data

US 2002/0004324 A1 Jan. 10, 2002

(30) Foreign Application Priority Data

| Apr. 10, 2000 | (JP) | ............ 2000-108051 |
| Oct. 27, 2000 | (JP) | ............ 2000-328727 |
| Jan. 18, 2001 | (JP) | ............ 2001-009864 |

(51) Int. Cl.$^7$ ................................. H05K 1/16
(52) U.S. Cl. .......... 174/256; 174/260; 174/264; 174/255; 361/686; 361/757; 361/760; 361/791; 257/765; 257/780
(58) Field of Search ............... 174/260, 255, 174/256, 264; 361/686, 757, 760, 791, 792, 793, 794, 795; 257/780, 765

(56) References Cited

U.S. PATENT DOCUMENTS

| 4,060,828 A | * | 11/1977 | Satonaka ............... 257/774 |
| 4,176,443 A | * | 12/1979 | Iannuzzi et al. ........ 438/106 |
| 4,418,857 A | * | 12/1983 | Ainslie et al. .......... 228/124.1 |
| 4,539,582 A | * | 9/1985 | Kuromaru ............... 257/784 |
| 4,672,739 A | * | 6/1987 | Churchwell et al. ...... 29/843 |
| 4,755,631 A | * | 7/1988 | Churchwell et al. ...... 174/258 |
| 4,974,052 A | * | 11/1990 | Ichiyama ................. 257/793 |
| 5,293,073 A | * | 3/1994 | Ono ....................... 257/740 |
| 5,298,793 A | * | 3/1994 | Kotani et al. ............. 257/765 |
| 5,495,667 A | * | 3/1996 | Farnworth et al. ....... 29/843 |

FOREIGN PATENT DOCUMENTS

| JP | 63-272061 | 11/1988 |
| JP | 6-21312 | 1/1994 |
| JP | 2000-049252 | 2/2000 |
| JP | 2000-164786 | 6/2000 |

* cited by examiner

Primary Examiner—Albert W. Paladini
Assistant Examiner—José H. Alcala
(74) Attorney, Agent, or Firm—Morgan, Lewis & Bockius LLP

(57) ABSTRACT

A pin standing resin substrate 311 comprises a resin substrate 313 and many pins 301 soldered (HD) to a pin-pad 317A, the resin substrate comprising such as a resin and having a pin-pad 317AP whose diameter of a portion exposed in a main surface 313A is 0.9 to 1.1 mm. The kovar-made pin 301 is previously heat-treated at 700° C., whereby Vickers hardness is made Hv=around 150, and the pin has a rod-like portion 301A of a diameter being 0.3 mm and an enlarged diameter portion 301B shaped in disk being 0.60 to 0.70 mm and thickness being 0.15 to 0.20 mm, the enlarged diameter portion being formed at one end of the rod-like portion 301A. This enlarged diameter portion 301B is soldered to the pin-pad.

6 Claims, 10 Drawing Sheets

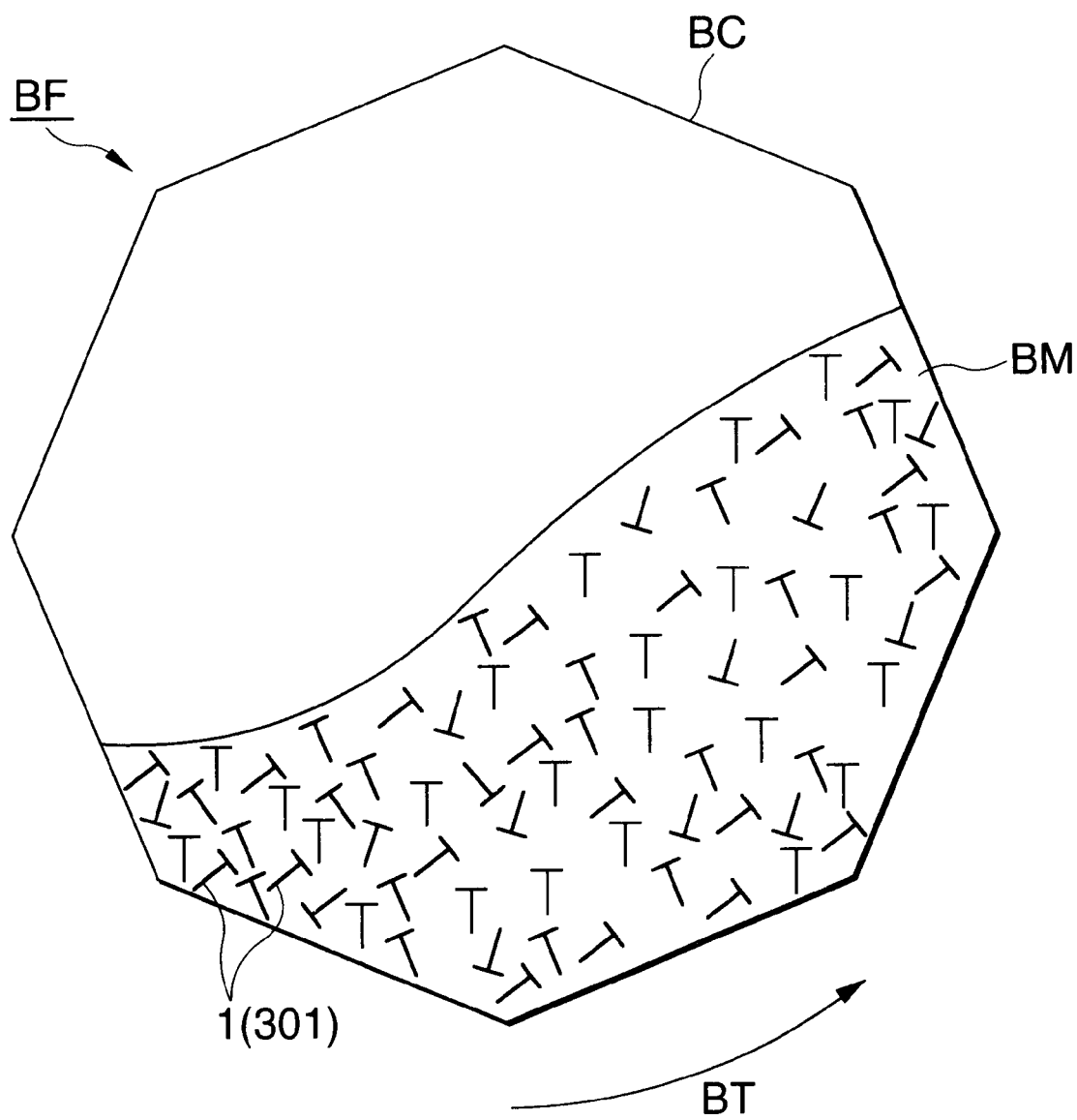

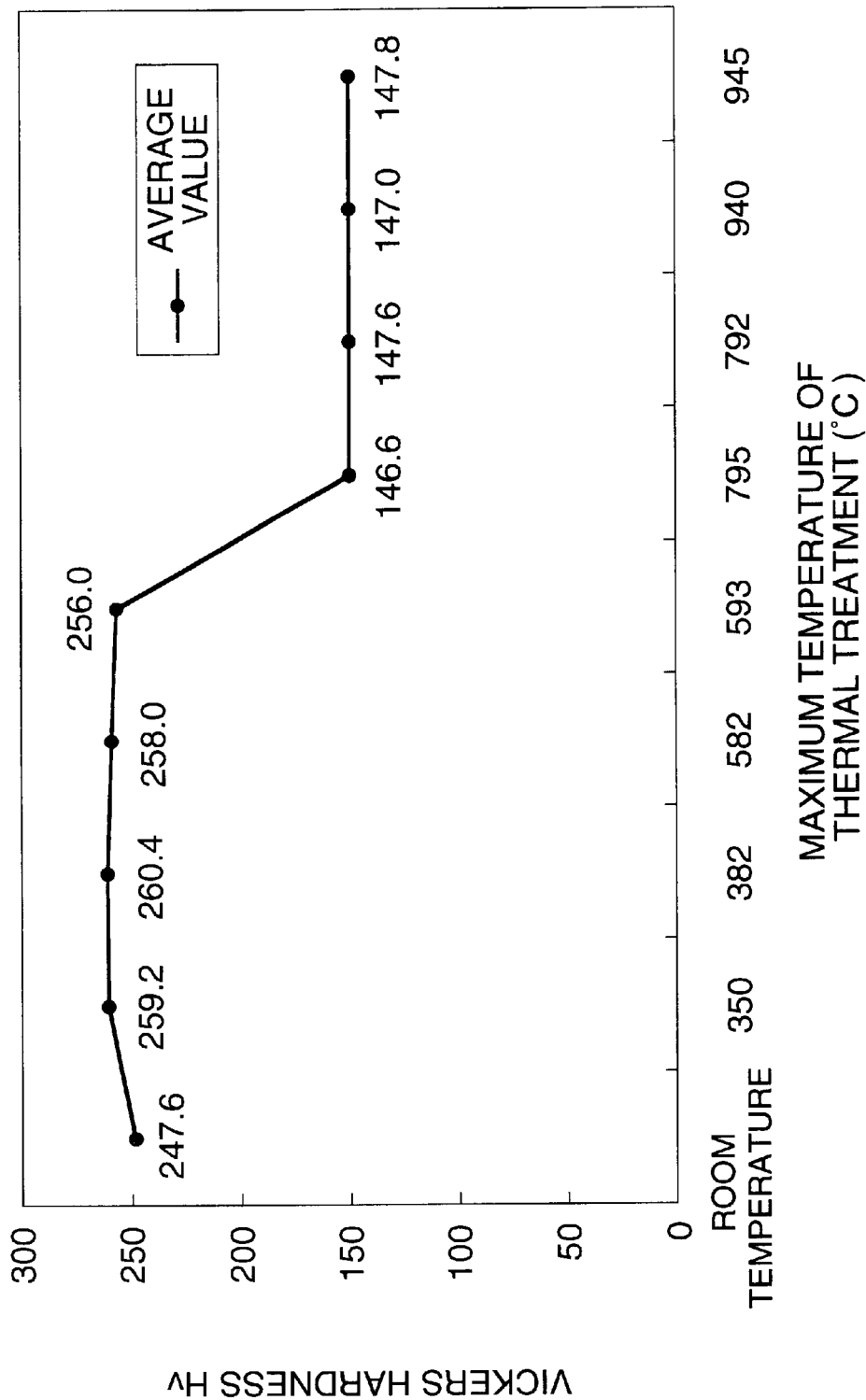

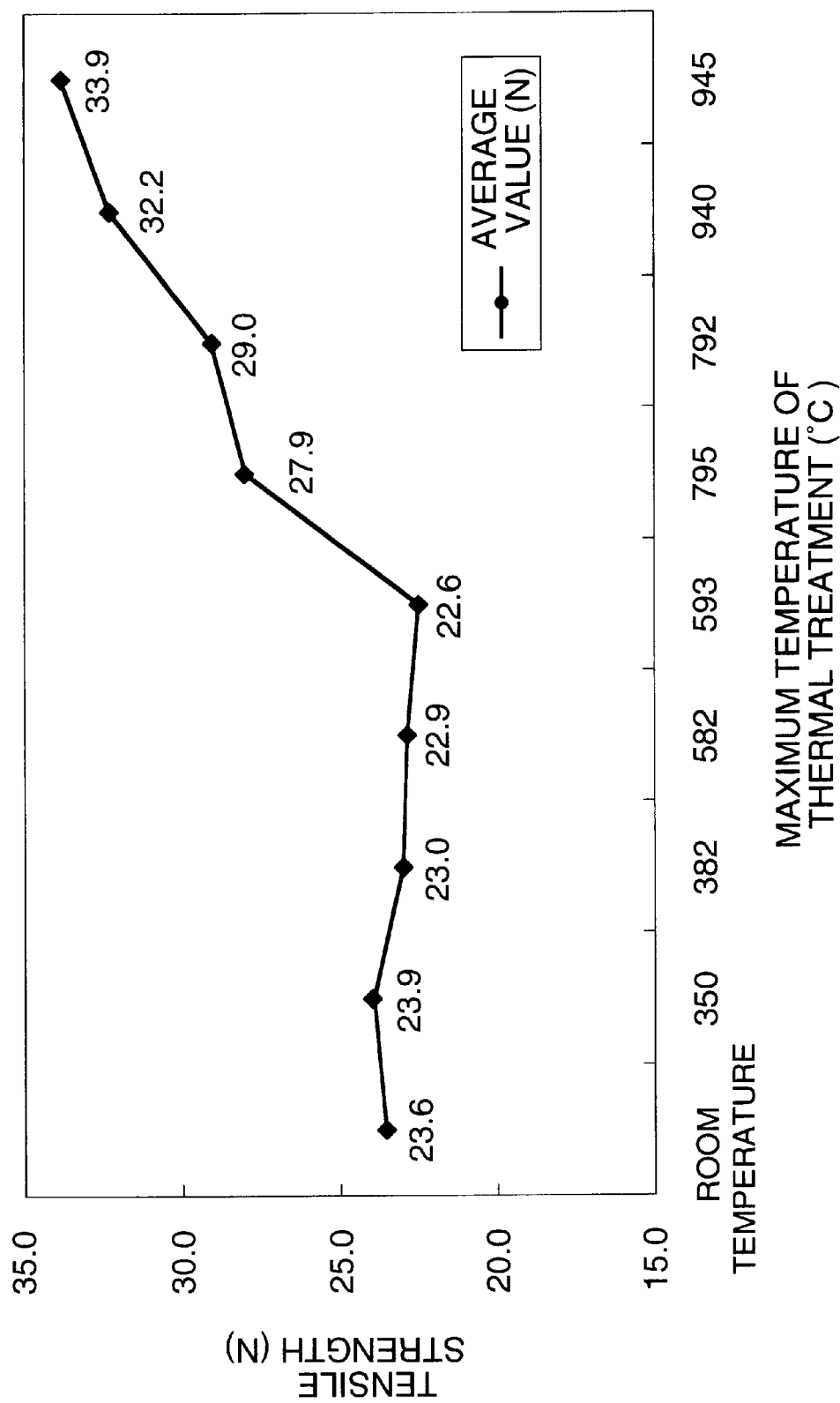

VICKERS HARDNESS Hv
AND TENSILE STRENGTH (N)

PIN SOLDER JOINTED TO A RESIN SUBSTRATE, MADE HAVING A PREDETERMINED HARDNESS AND DIMENSIONS

BACKGROUND OF THE INVENTION

1. Field of the Invention

The invention relates a pin standing resin (pin grid array) substrate, a method of making the same, pins, and a method of making the same, the pin being fabricated with a kovar (Fe—Ni—Co alloy) or a 42 alloy (Ni (42 wt %)—Fe alloy) serving as an input terminal and/or an output terminal thereon.

2. Description of the Related Art

A pin standing resin substrate has conventionally been known where pins as input and output terminals are stood on a resin substrate comprising a resin or a composite material containing a resin.

For example, FIG. 10 shows a partially enlarged cross sectional view of the pin standing resin substrate 201. The pin standing resin substrate 201 comprises a resin substrate 203 having a substantially rectangular and substantially plate-like (plated) shape and a lot of pins 221 stood thereon.

Of the two members, the resin substrate 203 has a resin insulating layer 205 formed with wired layers (not shown) inside or in a surface thereof, and many pin-pads 209 exposed from a solder resist layer 207 are formed on the main surface 203A (an upper portion in FIG. 10).

On the other hand, the pin 221 comprises the kovar, and comprises a rod like portion 221A of almost columnar shape and an enlarged diameter portion 221B of almost disk shape formed on the pin-pad 209. The pin 221 is fixed to the resin substrate 203 by connecting the whole enlarged diameter portion 221B and a part of the rod like portion 221A to the pin-pad 209 by means of a solder HD.

However, in such a pin standing resin substrate 201, in case the pin 221 receives a load, for example, when pulling the pin 221, the pin 221 (the rod like portion 221A) is not broken but, prior to this breaking, the resin substrate 203 (the pin-pad 209 and a lower portion thereof) is destroyed, and the solder-connected portion of the pin 221 and the pin-pad 209 might be destroyed.

In particular, for forming lots of inlet and outlet terminals on the resin substrates 203, it has been demanded to reduce pins in size and height. For example, in the pin standing resin substrate of reducing the diameter of the pin-pad 209 to be 0.9 to 1.1 mm, demands are that a total full length of the rod like portion and the enlarged diameter portion of the pin 221 is about 2 mm, a diameter of the rod like portion is about 0.3 mm, a diameter of the enlarged diameter portion is below 0.7 mm and a thickness thereof is under 0.2 mm. On the other hand, although such small sized pins are used, further demands are that bonding strength should be maintained high, for example, tensile strength at a 30 degree obliquity (tensile strength inclined 30 degrees) is to be 25.5 N (=2.60 kgf) or more, and further a minimum value is to be 22.2 N (=2.27 kgf) or more.

However, with respect to the pin standing resin substrates employing such small sized pins and pin-pads, although sizes are changed within ranges allowed in the above mentioned pins, requisite bonding strength (the tensile strength at the 30degree obliquity is 25.5 N or more in the average value, and 22.2 N or more in the minimum value) could not be satisfied.

SUMMARY OF THE INVENTION

The present invention has been realized in view of such circumstances, and it is an object of the invention to offer a pin standing resin substrate, the pin of which is less to be broken in case of receiving stress on pins, a method of making the same, pins to be used to the pin standing substrate, and a method of making the same.

BRIEF DESCRIPTION OF THE DRAWINGS

FIG. 2A is a view for explaining a condition of holding a wire material with press dies, and FIG. 2B is a view for explaining a condition of forming the enlarged diameter portion.

FIG. 3 is a schematic view of the process of barrel polishing pins.

FIG. 5A is a side view thereof, and FIG. 5B is a partially enlarged cross sectional view of the same.

FIG. 6 is a graph showing the relationship between the maximum temperatures of the heat treatment and the average values of Vickers hardness Hv with respect to kovar-made pins heat-treated at different temperatures.

FIG. 7 is a graph showing the relationship between the maximum temperatures of the heat treatment and the average values of tensile strength with respect to pin standing resin-substrate under the tension test of the 30 degree obliquity, the pins comprising kovar and heat-treated at different temperatures.

FIG. 9A is a state of applying the soldering paste to the pin-pad of the resin substrate, FIG. 9B is a state of mounting the pin standing jig on the resin substrate for contacting the pin enlarged diameter portions to the soldering paste, and FIG. 9C is a view for explaining a state of soldering the pins to the pin-pad by re-flowing.

Figure 1:
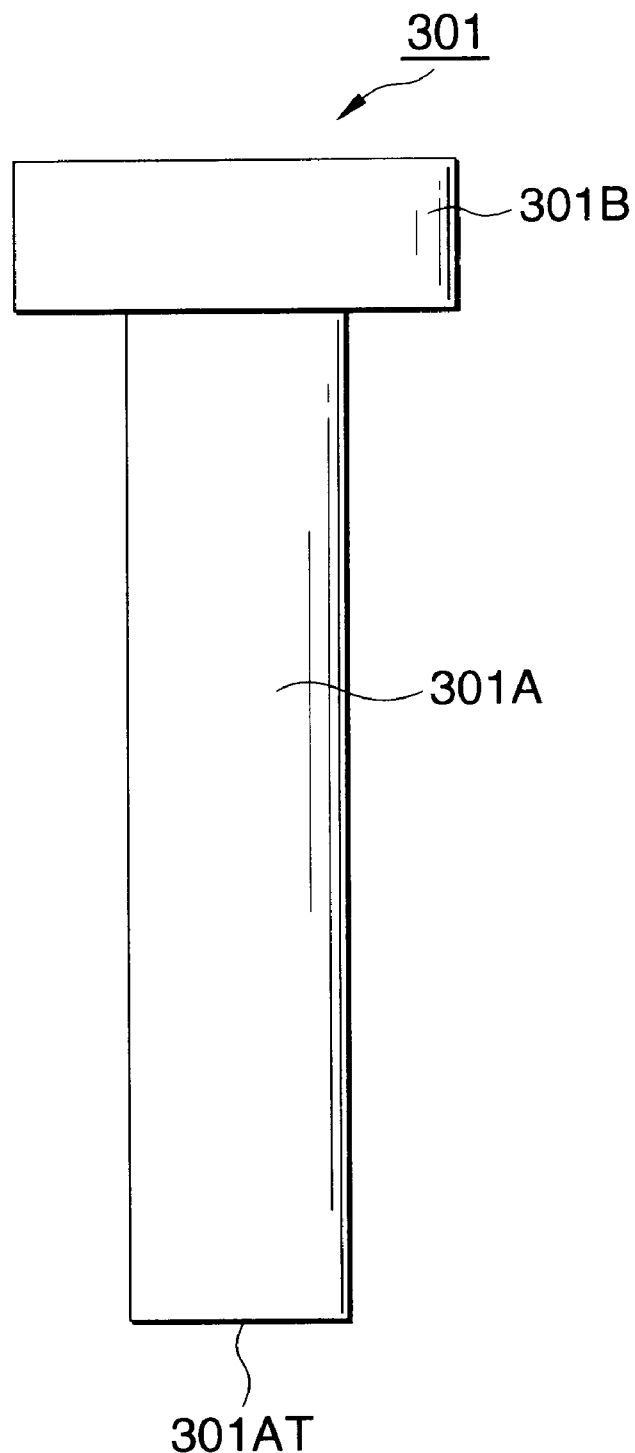
FIG. 1 is a side view showing a shape of the pin according to the embodiment.

301: Pin
301A: Rod-like portion
301B: Enlarged diameter portion
311: Pin standing resin substrate
313: Resin substrate
313A: Main surface of resin substrate
317AP: Pin-pad
321: Solder resist layer
HD: Solder

DETAILED DESCRIPTION OF THE INVENTION

Means for solving the problem is such a pin standing resin substrate, which comprises a resin substrate and a pin soldered to a pin-pad thereof, the resin substrate being substantially shaped in plate having a main surface, comprising a resin or a composite material comprising a resin, and having the pin-pad whose diameter of a portion exposed in the main surface is 0.9 to 1.1 mm, and wherein the pin has a rod-like portion comprising one of a kovar and a 42 alloy, and an enlarged diameter portion which has the same material as the rod-like portion, the diameter thereof being 0.60 to 0.70 mm and larger than the rod-like portion and thickness thereof being 0.15 to 0.20 mm, the enlarged diameter portion being formed at one end of the rod-like portion, Vickers hardness Hv of the pin being $\leq 200$, and at least the enlarged diameter portion being soldered to the pin-pad.

A pin comprising the kovar or the 42 alloy is generally produced by forming a wire material of the kovar or the 42 alloy in a predetermined shape, and for forming in a predetermined shape, the wire material is processed to a drawing, but the wire is hardened owing to a processed strain, and is also hardened by processing to form the enlarged diameter portion. Therefore, the pin is made harder than the blank material itself (actually Hv=around 250). As such a hard pin is difficult to deform, and if the pin is secured to the resin substrate by soldering, it is difficult to absorb stress generated between the solder and the resin substrate. It is assumed that when the pin is effected with stress, it is deformed and difficult to absorb stress, and destruction is easy to occur in the interior of the resin substrate or between the pin and the resin substrate.

In contrast, according to the invention, in spite of the pin comprising the kovar or the 42 alloy, soft pins are used, practically such pins of Vickers hardness Hv$\leq$200 are used. Thus, when the pin receives stress, the pin itself is deformed to absorb stress, so that it is possible to lighten stress caused when soldering the pin to the resin substrate, stress loaded to the connected portion between the pin and the resin substrate owing to tension, or stress effecting to the main body of the resin substrate.

Besides, it is specified that the diameter of a pin-pad in the resin substrate is 0.9 to 1.1 mm, the diameter of the enlarged diameter portion of the pin is 0.60 to 0.70 mm, and the thickness is 0.15 to 0.20 mm. In this kind of the pin-pad and the pin, with respect to the resin substrate having the diameter of the pin-pad being 0.9 to 1.1 mm, it is requested that the diameter of the enlarged diameter portion of the pin is 0.70 mm or smaller and the thickness thereof is 0.20 mm or smaller. It is possible to, in these ranges, maintain strength of 25.5 N or more especially in the average value as to the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, this pin standing resin substrate is difficult to be destroyed, even if the pin receives stress, and it has high reliability.

For imparting Vickers hardness Hv$\leq$200 to pins, any technique may be sufficient, and other than a manner not hardening pins such as casting, there are enumerated a manner of once forming pins, followed by heating them, depending on pressing, for example, locating pins in a high frequency electromagnetic field and heating them, radiating a laser beam to heat pins, throwing pins into a furnace having a heater to heat them by a radiant heat.

"The exposed portion of the pin-pad" referred to in the present description is meant by a portion exposed from an opening formed in the resin substrate, when a resin insulating layer such as a solder resist layer is formed on the periphery of the pin-pad, and it is meant by the whole of the pin-pad when the periphery of the pin-pad is exposed. The shape of the exposed portion in the pin-pad is ordinarily circular and may be other shapes as elliptic or rectangular. Therefore, the diameter of the exposed pin-pad is meant by the diameter of the pin-pad when the exposed portion is circular, and by a minimum size in the diameter when it is elliptic or rectangular.

Another means for solving the problem is such a pin standing resin substrate, comprising a resin substrate and a pin soldered to a pin-pad, the resin substrate being substantially shaped in plate having a main surface, comprising a resin or a composite material comprising a resin, and having a pin-pad whose diameter of a portion exposed in the main surface is 0.9 to 1.1 mm, and wherein the pin heat-treated at 700° C. or higher after forming the pin has a rod-like portion comprising one of a kovar and a 42 alloy, and an enlarged diameter portion which has the same material as the rod-like portion, the diameter thereof being 0.60 to 0.70 mm and larger than the rod-like portion and thickness thereof being 0.15 to 0.20 mm, the enlarged diameter portion being formed at one end of the rod-like portion, and at least the enlarged diameter portion being soldered to the pin-pad.

As mentioned above, a pin comprising the kovar or the 42 alloy is work-hardened when a blank material is processed into a wire or by processing to form the enlarged diameter portion, and the pin is made harder than the blank material itself, actually Hv=around 250 is considered It is assumed that if such a hard pin is secured to the resin substrate by soldering, the pin is deformed and difficult to absorb stress in relation with the soldering or stress given from an outside, and destruction is easy to occur in an interior of the resin substrate or between the pin and the resin substrate.

In contrast, according to the invention, the pin comprising the kovar is heat-treated at 700° C. or higher. If the pin comprising the kovar or the 42 alloy, the work-hardening is dissolved and the pin is softened. Thus, when the pin receives stress, the pin itself is deformed to absorb stress, so that it is possible to lighten stress effected to the connected portion between the pin and the resin substrate, or stress loading to the main body of the resin substrate.

Besides, it is specified that the diameter of a pin-pad in the resin substrate is 0.9 to 1.1 mm, the diameter of the enlarged diameter portion of the pin is 0.60 to 0.70 mm, and the thickness is 0.15 to 0.20 mm. In this kind of the pin-pad and the pin, with respect to the resin substrate having the diameter of the pin-pad being 0.9 to 1.1 mm, it is requested that the diameter of the enlarged diameter portion of the pin is 0.70 mm or smaller and the thickness thereof is 0.20 mm or smaller. It is possible to, in these ranges, maintain strength of 25.5 N or more especially in the average value as to the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, this pin standing resin substrate is difficult to be destroyed, even if the pin receives stress, and it is high in reliability.

Incidentally, in a pin standing ceramic-made substrate, conventionally, the pin is heat-treated at high temperatures. This is why the pin is soldered to the ceramic-made substrate, and when connecting, the pin is exposed of itself to high temperatures as around 800° C.

On the other hand, in the pin standing resin substrate, taking a heat resistance of the resin substrate into consideration, the pin is soldered at relatively low temperatures as 200 to 300° C., and the pin is not exposed to high temperatures, and it is hard, and cannot absorb stress so much.

But, in the invention, as the pin is previously heat-treated at a higher temperature than a soldering temperature before soldering, the stress is easily absorbed in the pin, and the pin standing resin substrate is difficult to be broken.

Temperature for heat-treating pins is sufficient at 700° C. or higher, and if heating 900° C. or higher, highly connecting reliability may be especially provided as the tensile strength becomes enough high. For heat-treating the kovar or the 42 alloy, it is sufficient to appropriately select temperatures within ranges lower than their melting points. If treating at too high temperatures, taking high cost for heating into consideration, for example, 1100° C. or lower is desirable.

The pin standing resin substrate as described in any of the above statement is preferable if the pin has the average values of the tensile strength at the 30 degree obliquity is 25.5 N or more.

In such pin standing resin substrates, the bonding strength of the pin is high, and even if stress is loaded on the pin, it is difficult to be broken, and the pin has high reliability.

Herein, it is preferable to produce the pin standing resin substrate where a mechanically polishing is performed on the pin after forming the pin and prior to the heat treatment.

When the pin is formed by such as pressing, it sometimes has burrs at several parts or is formed with sharp corners. These burrs or sharp corners easily peel and fall as metal particles onto the substrate or attach to other electronic parts to cause short circuit or bad insulation. Therefore, it is practiced to remove burrs or chamfer sharp corners through a mechanical polishing such as a barrel polishing. The mechanical polishing may, if after forming the pin, be performed before or after the heat treatment.

However, if the mechanical polishing is carried out, media or abrasive grains collide to the pin surface, and it is hardened. Therefore, if the mechanical polishing is done after the pin is softened by the heat treatment, the once softened pin is undesirably again hardened.

On the other hand, if the pin is performed with the mechanical polishing prior to the heat treatment, even if it is once hardened by the mechanical polishing, since the pin is sufficiently softened by the heat treatment thereafter, it is not affected with the mechanical polishing, and the enough soft pin is soldered, so that the pin standing resin substrate with the high reliability may be produced.

As the mechanical polishing, enumerated are, for example, the barrel polishing, sand blast, shot blast, water jet containing polishing grains, liquid horning, or brush body containing abrasive powder. As the mechanical polishing, it is preferable to use the barrel polishing. Because depending on the barrel polishing, many pins can be treated simultaneously and inexpensively, and burr removal and chamfer can be uniformly done.

A solder to be used to soldering may be appropriately selected, taking into consideration a heat resistance of the pin standing resin substrate, soldering temperatures for mounting electronic parts such as IC chips on the pin standing resin substrate, and others. For example, Sn/Sb-, Pb/Sn- or Sn/Ag-solders may be listed up. In these solders, there are included solders which are added with Cu, Ag, Bi, Au, Pb, In, Al, or As.

Accordingly, the pin standing resin substrate as described in any of the above statement is preferable if the solder is any of Sn/Sb-, Pb/Sn- or Sn/Ag-solders.

Of them, in comparison with Pb/Sn-solder, Sn/Sb-solder has somewhat low wettability and is relatively less to spread the wetting, so that a height of the solder creeping up on the rod-like portion can be controlled to be low, and in this regard this solder is preferable.

The pin standing resin substrate as described in any of the above statement is sufficient if the enlarged diameter portion of the pin is 0.65 to 0.70 mm.

If the enlarged diameter portion of the pin is specified to be 0.65 to 0.70 mm, the bonding strength is made higher, and in the tensile strength at the 30 degree obliquity, the average value is 25.5 N or more, and the minimum value can be maintained 22.2 N or more.

Thus, the pin standing resin substrate is preferable if the pin has the minimum values of the tensile strength at the 30 degree obliquity is 22.2 N or more.

In such pin standing resin substrates, the bonding strength of the pin is high, and there is not such a pin which is extremely weak in the bonding strength owing to dispersion in the bonding strength, and even if stress is loaded on the pin, it is difficult to be broken and so has high reliability.

Further means for solving the problems is such a method of making a pin standing resin substrate, comprising a step of lowering hardness of a pin to Vickers hardness Hv being $\leq 200$, the pin having a rod-like portion comprising one of a kovar and a 42 alloy, and an enlarged diameter portion which has the same material as the rod-like portion, the diameter thereof being 0.60 to 0.70 mm and larger than the rod-like portion and thickness thereof being 0.15 to 0.20 mm, the enlarged diameter portion being formed at one end of the rod-like portion, and with respect to the resin substrate being substantially shaped in plate having a main surface, comprising a resin or a composite material comprising a resin, and having a pin-pad whose diameter of a portion exposed in the main surface is 0.9 to 1.1 mm, a step of fixing the pin-pad with at least the enlarged diameter portion of the pin by soldering.

According to the invention, although using the kovar or the 42 alloy, in the step of lowering the pin hardness, the Vickers hardness of the pin is lowered to Hv$\leq 200$. In the step of fixing the pin, the pin softened by lowering the hardness is soldered to the pin-pad of the resin substrate.

Accordingly, in the produced pin standing resin substrate, it is possible to absorb stress generated by soldering between the pin and the resin substrate (the pin-pad) or absorb stress loaded from the outside by the deformation of the pin itself, thereby to lightening stress loading to the connection between the pin and the resin substrate or to the resin substrate itself.

In the pin lowering the Vickers hardness, the diameter of the enlarged diameter portion is 0.60 to 0.70 mm, the thickness ranges 0.15 to 0.20 mm, and the pin-pad diameter of the resin substrate for soldering the pin is 0.9 to 1.1 mm. In this kind of the pin-pad and the pin, with respect to the resin substrate having the diameter of the pin-pad being 0.9 to 1.1 mm, it is requested that the diameter of the enlarged diameter portion of the pin is 0.70 mm or smaller and the thickness thereof is 0.20 mm or smaller. It is possible to, in these ranges, maintain strength of 25.5 N or more especially in the average value as to the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, this pin standing resin substrate is difficult to be destroyed, even if the pin receives stress, and it is high in reliability.

For lowering pins to the Vickers hardness Hv≦200, any technique may be sufficient, and there are enumerated manners of heating to soften pins such as locating pins once formed through an ordinary technique in a high frequency electro-magnetic field and heating them, radiating a laser beam to heat pins, throwing pins into a furnace having a heater to heat them by a radiant heat.

A method of making the above pin standing resin substrate is preferable if this is such a method where the lowering step of the pin hardness depends on a heat treatment of passing pins through a belt furnace so as to lower the Vickers hardness.

Depending on the heat treatment in the belt furnace, the whole of the pin can be heat-treated uniformly, exactly and inexpensively, so that the pin standing resin substrate is available at low cost.

Still further means for solving the problems is such a method of making a pin standing resin substrate, comprising, with respect to resin substrate being substantially shaped in plate having a main surface, comprising a resin or a composite material comprising a resin, and having a pin-pad whose diameter of a portion exposed in the main surface is 0.9 to 1.1 mm, a step of fixing the pin-pad to at least the enlarged diameter portion of the pin by soldering, wherein the pin has a rod-like portion comprising one of a kovar and a 42 alloy, the enlarged diameter portion having the same material as the rod-like portion, having a diameter of 0.60 to 0.70 mm, having a larger diameter than the rod-like portion, being formed at one end of the rod-like portion, and being 0.15 to 0.20 mm in thickness, the enlarged diameter portion having Vickers hardness Hv of the pin being≦200, and a step of fixing the pin-pad to at least enlarged diameter portion of the pin by soldering.

According to the invention, in spite of the pin of the kovar or the 42 alloy, the pin of the Vickers hardness Hv≦200 is used. In the step of fixing the pin, the pin softened by lowering the hardness is soldered to the pin-pad of the resin substrate.

Accordingly, in the produced pin standing resin substrate, it is possible to absorb stress generated by soldering between the pin and the resin substrate (the pin-pad) or stress loaded from the outside by the deformation of the pin itself, thereby to lightening stress loading to the connection between the pin and the resin substrate or to the resin substrate itself.

In the pin of the Vickers hardness Hv≦200, the diameter of the enlarged diameter portion is 0.60 to 0.70 mm, the thickness ranges 0.15 to 0.20 mm, and the pin-pad diameter of the resin substrate for soldering the pin is 0.9 to 1.1 mm.

In this kind of the pin-pad and the pin, with respect to the resin substrate having the diameter of the pin-pad being 0.9 to 1.1 mm, it is requested that the diameter of the enlarged diameter portion of the pin is 0.70 mm or smaller and the thickness thereof is 0.20 mm or smaller. It is possible to, in these ranges, maintain strength of 25.5 N or more especially in the average value as to the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, this pin standing resin substrate is difficult to be destroyed, even if the pin receives stress, and it is high in reliability.

Yet further means for solving the problems is such a method of making a pin standing resin substrate, comprising a step of heat-treating by heating a pin at 700° C. or higher, the pin having a rod-like portion comprising one of a kovar and a 42 alloy, and an enlarged diameter portion which has the same material as the rod-like portion, the diameter thereof being 0.60 to 0.70 mm larger than the rod-like portion and thickness thereof being 0.15 to 0.20 mm, the enlarged diameter portion being formed at one end of the rod-like portion, and with respect to the resin substrate being substantially shaped in plate having a main surface, comprising a resin or a composite material comprising a resin, and having a pin-pad whose diameter of a portion exposed in the main surface is 0.9 to 1.1 mm, a step of fixing the pin-pad to at least the enlarged diameter portion of the pin by soldering.

According to the invention, in the pin heat-treating step, since the pin of the kovar or the 42 alloy is heated at 700° C. or higher, the pin is thereby softened certainly and fully.

In the pin fixing step, the softened pins are soldered to the pin-pad of the resin substrate.

Therefore, it is possible to absorb stress generated by soldering between the pin and the resin substrate (the pin-pad) or stress loaded from the outside by the deformation of the pin itself, thereby to lightening stress loading to the connection between the pin and the resin substrate or to the resin substrate itself.

In the pin comprising such as the kovar having the Vickers hardness Hv≦200, the diameter of the enlarged diameter portion is 0.60 to 0.70 mm, the thickness ranges 0.15 to 0.20 mm, and the pin-pad diameter of the resin substrate for soldering the 20 pin is 0.9 to 1.1 mm. In this kind of the pin-pad and the pin, with respect to the resin substrate having the diameter of the pin-pad being 0.9 to 1.1 mm, it is requested that the diameter of the enlarged diameter portion of the pin is 0.70 mm or smaller and the thickness thereof is 0.20 mm smaller. It is possible to, in these ranges, maintain strength of 25.5 N or more especially in the average value as to the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, this pin standing resin substrate is difficult to be destroyed, even if the pin receives stress, and it is high in reliability.

For heat-treating the kovar or the 42 alloy, it is sufficient to appropriately select temperatures within ranges lower than their melting points. If treating at too high temperatures, taking high cost for heating into consideration, for example, 1100° C. or lower is desirable.

The method of making the pin standing resin substrate is preferable if this is such a method having a mechanically polishing step where the pin is mechanically polished prior to the heat treatment.

When the pin is formed by such as pressing, it sometimes has burrs at several parts or is formed with sharp corners. These burrs or sharp corners easily peel and fall as metal particles onto the substrate or attach to other electronic parts to cause short circuit or bad insulation. Therefore, it is practiced to remove burrs or chamfer sharp corners through a mechanical polishing such as a barrel polishing. The mechanical polishing may be performed before or after the heat treatment.

However, if the mechanical polishing is carried out, media or abrasive grains collide to the pin surface, and it is hardened.

Therefore, if the mechanical polishing is done after the pin is softened by the heat treatment, the once softened pin is undesirably again hardened.

On the other hand, the invention has the mechanically polishing step prior to the pin heating treatment, even if it is hardened by the mechanical polishing, since the pin is softened by the heat treatment, it is not affected with the mechanical polishing, and the enough soft pin can be fixed to the pin-pad, so that the pin standing resin substrate less in destruction with the high reliability may be produced.

As mentioned above, the mechanical polishing steps are enumerated, for example, the barrel polishing, sandblast, shot blast, water jet containing polishing grains, liquid horning, or brush body containing abrasive powder. As the mechanical polishing, it is preferable to use the barrel polishing.

In particular, the method of making the pin standing resin substrate is preferable if the mechanically polishing step is a barrel polishing step for the pin.

The invention adopts the barrel polishing step as the mechanical polishing. Because depending on the barrel polishing, many pins can be treated simultaneously and inexpensively, and burr removal and chamfer can be uniformly done.

Another means for solving the problems is such a method of making a pin standing resin substrate, comprising, with respect to resin substrate being substantially shaped in plate having a main surface, comprising a resin or a composite material comprising a resin, and having a pin-pad whose diameter of a portion exposed in the main surface is 0.9 to 1.1 mm, a step of fixing the pin-pad to the enlarged diameter portion of the pin by soldering, wherein the enlarged diameter portion of the pin has a rod-like portion comprising one of a kovar and a 42 alloy, the enlarged diameter portion having the same material as the rod-like portion, having a diameter of 0.60 to 0.70 mm, has a larger diameter than the rod-like portion, being formed at one end of the rod-like portion, and being 0.15 to 0.20 mm in thickness, the pin heat-treated at 700° C. or higher.

According to the invention, in the pin fixing step, since the pin of the kovar or the 42 alloy heated at 700° C. or higher is connected to the pin-pad of the resin substrate.

Such pins heat-treated at 700° C. or higher are softened securely and fully. Accordingly, it is possible to absorb stress generated by soldering between the pin and the resin substrate (the pin-pad) or absorb stress loaded from the outside by the deformation of the pin itself, thereby to lightening stress loading to the connection between the pin and the resin substrate or to the resin substrate itself.

In the pin of such as the kovar, the diameter of the enlarged diameter portion is 0.60 to 0.70 mm, the thickness ranges 0.15 to 0.20 mm, and the pin-pad diameter of the resin substrate for soldering the pin is 0.9 to 1.1 mm. In this kind of the pin-pad and the pin, with respect to the resin substrate having the diameter of the pin-pad being 0.9 to 1.1 mm, it is requested that the diameter of the enlarged diameter portion of the pin is 0.70 mm or smaller and the thickness thereof is 0.20 mm or smaller. It is possible to, in these ranges, maintain strength of 25.5 N or more especially in the average value as to the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, this pin standing resin substrate is difficult to be destroyed, even if the pin receives stress, and it is high in reliability.

For heat-treating the kovar or the 42 alloy, it is sufficient to appropriately select temperatures within ranges lower than their melting points. If treating at too high temperatures, taking high cost for heating into consideration, for example, 1100° C. or lower is desirable.

Herein, the method of making the pin standing resin substrate is preferable if this is such a method having a mechanically polishing step where the pin is mechanically polished prior to the heat treatment.

When the pin is formed, it sometimes has burrs or sharp corners. These burrs or sharp corners peel and fall as metal particles to cause short circuit or bad insulation in the substrate or other electronic parts. Therefore, it is practiced to remove burrs or chamfer sharp corners through a mechanical polishing such as a barrel polishing. The mechanical polishing may be performed before or after the heat treatment.

However, if the mechanical polishing is carried out, media or abrasive grains collide to the pin surface, and it is hardened. Therefore, if the mechanical polishing is done after the pin is softened by the heat treatment, the once softened pin is undesirably again hardened On the other hand, if the pin is performed with the mechanical polishing prior to the heat treatment, even if it is once hardened by the mechanical polishing, the pin is sufficiently softened by the heat treatment thereafter. So, if using such pins, the pin standing resin substrate with the high reliability may be produced.

Among the mechanically polishing treatments, the barrel polishing is desirable. Because depending on the barrel polishing, many pins can be treated simultaneously and inexpensively, and burr removal and chamfer can be uniformly done.

The method of making pin standing resin substrate as described in any of the above statement is preferable if the enlarged diameter portion of the pin is 0.65 to 0.70 mm.

If producing the pin standing resin substrate specifying the enlarged diameter portion of the pin to be 0.65 to 0.70 mm, the bonding strength of the pin is made higher, and in the tensile strength at the 30 degree obliquity, the average value is 25.5 N or more, and the minimum value can be maintained 22.2 N or more.

Another means for solving the problems is such a pin which is to be used to a substrate for standing a pin as an input terminal and an output terminal thereon, having a rod-like portion comprising one of a kovar and a 42 alloy, an enlarged diameter portion having the same material as the rod-like portion, having a diameter of 0.60 to 0.70 mm, having a larger diameter than the rod-like portion, being formed at one end of the rod-like portion, and being 0.15 to 0.20 mm in thickness, and Vickers hardness Hv being $\leq 200$.

Although the pin of the invention comprises the kovar or the 42 alloy, the pin is soft as the Vickers hardness Hv$\leq$200. Therefore, if using such pins to produce the pin standing resin substrate, it is possible to absorb stress generated by soldering between the pin and the resin substrate (the pin-pad) or absorb stress loaded from the outside by the deformation of the pin itself, thereby to lightening stress loading to the connection between the pin and the resin substrate or to the resin substrate itself.

In the pin comprising such as the kovar having the Vickers hardness Hv$\leq$200, the diameter of the enlarged diameter portion is 0.60 to 0.70 mm, the thickness ranges 0.15 to 0.20 mm. In this kind of the pins, it is required that the pin to be used to the pin-pad has the diameter of the enlarged diameter portion being 0.70 mm or less and the thickness thereof being 0.20 mm or less. As a matter of fact, in these ranges, if soldering the pins of the above range to the resin substrate having the pin-pad of the diameter being 0.9 to 1.1 mm, the bonding strength is particularly increased and the average values of 25.5 N or more can be secured in the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, if producing the pin standing resin substrate by using the inventive pins, even if the pin receives stress, it is such a pin standing resin substrate difficult to be destroyed, and high in reliability.

The above pin is good if heat-treating the pin to lower the Vickers hardness.

The pin of the invention is made by lowering the Vickers hardness by the heat treatment. Accordingly, it is unnecessary to use pins of low hardness from the beginning, but since pins are produced by the ordinary procedure and the Vickers hardness is lowered by the heat treatment thereafter, the pins are easily available at low cost.

Another means for solving the problem is such a method of making a pin which is to be used to a substrate for standing a pin as an input terminal and an output terminal thereon, comprising a step of lowering hardness of a pin to Vickers hardness Hv being$\leq$200, the pin having a rod like portion comprising one of a kovar and a 42 alloy, and an enlarged diameter portion which has the same material as the rod like portion, the diameter thereof being 0.60 to 0.70 mm and larger than the rod like portion and thickness thereof being 0.15 to 0.20 mm, the enlarged diameter portion being formed at one end of the rod-like portion.

Although the inventive pin comprises such as the kovar, since it is performed with the heat treatment by heating at 700° C. or higher, the pin is softer than pins which are not performed with the heat treatment. Therefore, if using such pins to produce the pin standing resin substrate, it is possible to absorb stress generated by soldering between the pin and the resin substrate (the pin-pad) or absorb stress loaded from the outside by the deformation of the pin itself, thereby to lightening stress loading to the connection between the pin and the resin substrate or to the resin substrate itself.

In the pin comprising such as the kovar and heat-treated at 700° C. or higher, the diameter of the enlarged diameter portion is 0.60 to 0.70 mm and the thickness ranges 0.15 to 0.20 mm. In this kind of the pins, it is required that the pin to be used to the pin-pad has the diameter of the enlarged diameter portion being 0.70 mm or less and the thickness thereof being 0.20 mm or less. As a matter of fact, in these ranges, if soldering the pins of the above range to the resin substrate having the pin-pad of the diameter being 0.9 to 1.1 mm, the bonding strength is particularly increased and the average values of 25.5 N or more can be secured in the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

Accordingly, if producing the pin standing resin substrate by using the inventive pins, even if the pin receives stress, it is such a pin standing resin substrate difficult to be destroyed, and high in reliability.

The above mentioned pin is preferable if mechanically polishing prior to the heat treatment.

When forming the pin, it has burrs or sharp corners. Therefore, it is practiced to previously remove burrs or chamfer sharp corners through the mechanical polishing such as a barrel polishing. The mechanical polishing may be performed before or after the heat treatment. However, if the mechanical polishing is carried out, media or abrasive grains collide to the pin surface, and it is hardened on the surface. Therefore, if the mechanical polishing is done after the heat treatment, the once softened pin is undesirably again hardened.

On the other hand, in the pin mechanically polished prior to the pin heating treatment, even if it is hardened by the mechanical polishing, it is not affected with the mechanical polishing, and the enough soft pin can be produced. Therefore, if using such pins to produce the pin standing resin substrate, the higher reliability will be brought about.

Among the mechanically polishing treatments, the barrel polishing is desirable. Because depending on the barrel polishing, many pins can be treated simultaneously and inexpensively, and burr removal and chamfer can be uniformly done.

The pin as described in any of the above statement is preferable if the enlarged diameter portion of the pin is 0.65 to 0.70 mm.

If specifying the enlarged diameter portion of the pin to be 0.65 to 0.70 mm, when using such pins to produce the pin standing resin substrate, the bonding strength of the pin is made higher, and in the tensile strength at the 30 degree obliquity, the average value is 25.5 N or more, and the minimum value can be maintained 22.2 N or more.

Further means for solving the problem is such a method of making a pin which is to be used to a substrate for standing a pin as an input terminal and an output terminal thereon, comprising a step of lowering hardness of a pin to Vickers hardness Hv being≦200, the pin having a rod-like portion comprising one of a kovar and a 42 alloy, and an enlarged diameter portion which has the same material as the rod-like portion, the diameter thereof being 0.60 to 0.70 mm and larger than the rod-like portion and thickness thereof being 0.15 to 0.20 mm, the enlarged diameter portion being formed at one end of the rod-like portion.

The method of the invention of making pins has the step of lowering the pin hardness by lowering the Vickers hardness. Accordingly, it is unnecessary to use pins of low hardness from the beginning, but since pins are produced by the ordinary procedure and the Vickers hardness is lowered by the heat treatment thereafter, the pins are easily available at low cost.

In the pin comprising such as the kovar having the Vickers hardness Hv≦200, the diameter of the enlarged diameter portion is 0.60 to 0.70 mm and the thickness range 0.15 to 0.20 mm. In this kind of the pins, it is required that the pin to be used to the pin-pad has the diameter of the enlarged diameter portion being 0.70 mm or less and the thickness thereof being 0.20 mm or less. As a matter of fact, in these ranges, if soldering the pins of the above ranges to the resin substrate having the pin-pad of the diameter being 0.9 to 1.1 mm, the bonding strength is particularly increased and the average values of 25.5 N or more can be secured in the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is particularly increased.

Accordingly, if producing the pin standing resin substrate by using the inventive pins, even if the pin receives stress, it is such a pin standing resin substrate difficult to be destroyed, and high in reliability.

The pin making method is preferable if the step of lowering the pin hardness decreases the Vickers hardness by heating pins.

A method of making the above pin standing resin substrate is preferable if this is such a method where the lowering step of the pin hardness depends on a heat treatment of passing pins through the belt furnace so as to lower the Vickers hardness. Depending on the heat treatment in the belt furnace, the whole of the pin can be heat-treated uniformly, exactly and inexpensively, so that the pin standing resin substrate is available at low cost.

Another means for solving the problem is such a method of a pin which is to be used to a substrate for standing a pin as an input terminal and an output terminal thereon, comprising a step of heating the pin at 700° C. or higher, the pin having a rod-like portion comprising one of a kovar and a 42 alloy, an enlarged diameter portion having the same material as the rod-like portion, having a diameter of 0.60 to 0.70 mm, having a larger diameter than the rod-like portion, being formed at one end of the rod-like portion, and being 0.15 to 0.20 mm in thickness.

According to the invention, pins of the kovar or the 42 alloy are heat-treated at 700° C. or higher, and softened certainly and fully. Therefore, it is unnecessary to use pins of low hardness from the beginning, but if hard pins are produced by the ordinary procedure or obtained, and heated by the heat treatment thereafter, the pins will be easily available at low cost.

If using such pins to produce the pin standing resin substrate, it is possible to absorb stress to the pin by the pin itself, thereby to lightening stress loading to the connection between the pin and the resin substrate.

In the pin comprising such as the kovar, the diameter of the enlarged diameter portion is 0.60 to 0.70 mm, the thickness ranges 0.15 to 0.20 mm. In this kind of the pins, it is required that the pin to be used to the pin-pad has the diameter of the enlarged diameter portion being 0.70mm or less and the thickness thereof being 0.20 mm or less. As a matter of fact, in these ranges, if soldering the pins of the above range to the resin substrate having the pin-pad of the diameter being 0.9 to 1.1 mm, the bonding strength is increased and the average values of 25.5 N or more can be secured in the tensile strength at the 30 degree obliquity.

It is considered that in the above range of the pin-pad, the diameter and the thickness of the enlarged diameter portion have the proper size by specifying the size of the pin to be within the above mentioned range, and in addition that a gentle soldering fillet is formed between the pin-pad and the resin substrate, as the pin is soft, stress loading on the substrate may be lightened and the bonding strength (e.g., tensile strength) is increased.

If using such pins to produce the pin standing resin substrate, it is possible to produce the pin standing resin substrate with high reliability in case of loading stress on pins.

Further, the above mentioned pin making method is preferable if mechanically polishing pins prior to the heat treatment.

When the pin is formed, it sometimes has burrs at several parts or is formed with sharp corners. These burrs or sharp corners easily peel and fall as metal particles onto the substrate or attach to other electronic parts to cause short circuit or bad insulation. Therefore, it is practiced to remove burrs or chamfer sharp corners through a mechanical polishing such as a barrel polishing. The mechanical polishing may be performed before or after the heat treatment.

However, if the mechanical polishing is carried out, media or abrasive grains collide to the pin surface, and it is hardened. Therefore, if the mechanical polishing is done after the pin is softened by the heat treatment, the once softened pin is undesirably again hardened.

On the other hand, the invention has the mechanically polishing step prior to the pin heating treatment, even if it is once hardened by the mechanical polishing, the pin can be softened by the heat treatment thereafter, and it is not affected with the mechanical polishing, and the enough soft pin may be produced.

In particular, the pin making method is preferable if the mechanically polishing step is a barrel polishing step for pins.

The invention adopts the barrel polishing step as the mechanical polishing. Because depending on the barrel polishing, many pins can be treated simultaneously and inexpensively, and burr removal and chamfer can be uniformly done.

The pin making method as described in any of the above statement is preferable if the diameter of the enlarged diameter portion of the pin is 0.65 to 0.70 mm.

If specifying the enlarged diameter portion of the pin to be 0.65 to 0.70 mm, when using such pins to produce the pin standing resin substrate, the bonding strength is made higher, and in the tensile strength at the 30 degree obliquity, the average value is 25.5 N or more, and the minimum value can be maintained 22.2 N or more.

Preferred Embodiments of the Invention (Embodiment 1)

Explanation will be made to the mode for carrying out the invention, referring to the attached drawings.

FIG. 1 shows a pin 301 of the present embodiment. The pin 301 is a small-sized pin comprising the kovar (iron-nickel-cobalt alloy, or 29Ni-16Co—Fe), and is formed on the surface with Ni plated layer of around 3 $\mu$m in thickness and Au plated layer of around 0.35 $\mu$m in thickness thereon (not shown). The pin 301 has a so-called nail head, and comprises a rod-like portion (shaft portion) 301A and an enlarged diameter portion (flange) 301B formed at one end thereof. The rod-like portion 301A is almost columnar of the diameter being around 0.30 mm, and the height (the length in an axial direction) being 1.80 mm, while the enlarged diameter portion 301B has almost disk-shaped of the diameter being 0.65 mm, the thickness (the length in the axial direction) being 0.20 mm, and the full length in the axial direction being 2.00 mm.

The pin 301 is heat-treated as later mentioned and is softened thereby, so that the Vickers hardness Hv is lowered.

Therefore, if the pin standing resin substrate is produced with the pins 301, stress loading on the pin 301 can be absorbed in the deformation of the pin 301 itself, thereby enabling to lighten the stress loading in the neighborhood of the connecting portion between the pin 301 and the resin substrate, or on the resin substrate itself.

Therefore, if producing the pin standing resin substrate by using the pins 301, even if the stress is loaded on the pins 301, it is possible to make the pin standing resin substrate less in destruction and high in reliability.

Further explanation will be made to the production of the pin 301 with reference to FIGS. 2, 3 and 4.

Figure 2A:
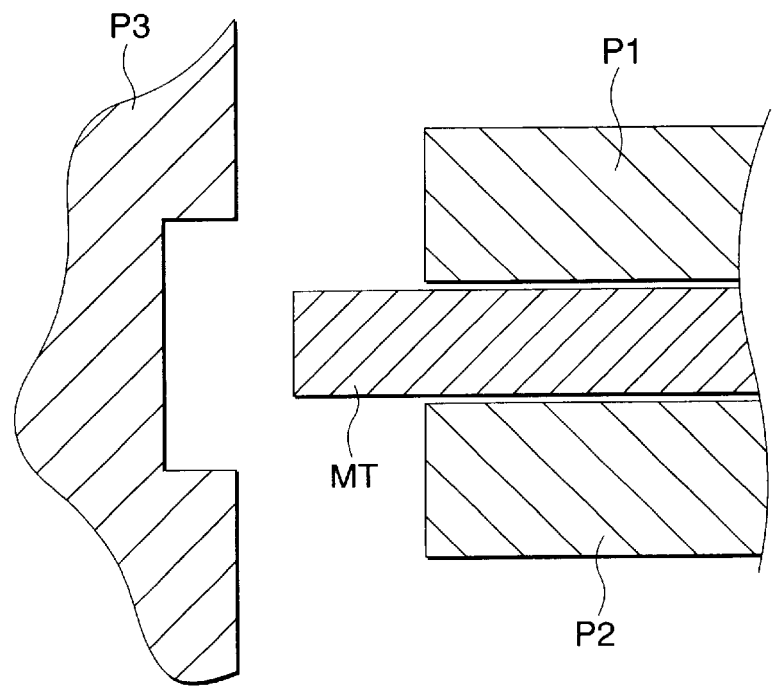
FIGS. 2A and 2B each is a view showing the pin making method, where
Figure 2B:
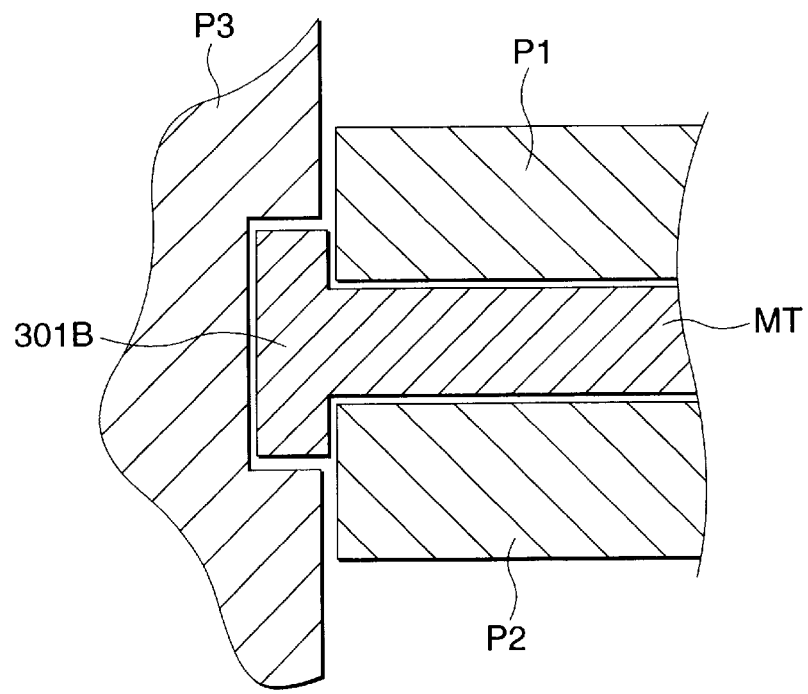

Firstly, such a wire material MT is prepared which comprises the kovar being substantially circular (the 0.3 mm diameter) in cross section (see FIG. 2A). In a holding step, as shown in FIG. 2A, press dies P1, P2 hold the wire material MT as protruding one part thereof. In succession, in a pressing step, as shown in FIG. 2B, the press dies P1, P2 and a press die P3 perform a pressing for forming an enlarged diameter portion 301B shaped in disk having a larger diameter than that of the wire material MT. If necessary, the pressing is repeated several times to adjust the shape of the enlarged diameter portion 301B. In a cutting step, the wire material MT is cut at a predetermined position so as to form a rod-like portion 301A having almost the same diameter of the wire material MT.

After cutting, for removing burrs or chamfering keen angles or sharp corners, the pin 301 is subjected to a surface smoothening treatment through the barrel polishing and the chemical etching by a know procedure.

Practically, in the barrel polishing step, using a known rotary barrel polishing apparatus BF as shown in FIG. 3, many pins 301 are thrown into a rotary container BC together with media BM comprising alumina based balls of 3.0 to 5.0 mm diameter, and the barrel polishing is carried out by rotating for several hours as shown with an arrow BT, so that burrs are removed from pins 301 and sharp corners are chamfered.

Subsequently, in the surface smoothening treatment of the barrel polished pins 301 with the chemical etching, the pin is immersed in an acid solution to partially dissolve the surface, thereby to effect smoothening thereon. By the way, if carrying out the surface smoothening treatment, preferably media BM and others adhering to as biting into the pin 301 are removed.

The thus formed pin 301 has a high hardness owing to the work hardening, since the wire material MT itself is shaped into a predetermined diameter by the drawing. The work hardening is also further caused by pressing to form the enlarged diameter portion 301B. Since the media MB collide against the pins 301 at the barrel polishing, the pin 301 is hardened on the surface also by the barrel polishing. Accordingly, the Vickers hardness Hv of the pin 301 goes up to the hardness of Hv=around 250.

Thereafter, in the heat-treating step, the pins 301 are heat-treated. Actually, as shown in FIG. 4, the pins 301 supported in a tray TR are heat-treated by mounting on a belt BL bridged between rollers RO1 and RO2, moving at a desired speed, heating by traveling through a belt furnace FP heated at a predetermined temperature profile by a heater HT, and slowly cooling. Specifically, the pins 301 at the belt speed of 150 mm/min were heated up till a maximum temperature 792° C., kept heated at 780° C. or higher for 4.5 minutes or longer, and slowly cooled. The slow cooling referred to in the present description is meant by slowly cooling, that it, moderately cooling.

The pin 301 is softened thereby in comparison with that prior to the heating treatment, in short, the hardness is brought down. Practically, as mentioned later, it is lowered till the Vickers hardness Hv=around 150. It is assumed that the pin is softened because the work hardening when forming the wire material or forming the enlarged diameter portion, or an internal structure of the pin 301 hardened by the barrel polishing, are changed and softened by the heating treatment.

If the pin 301 is softened, as explained under, in the pin standing resin substrate, it is possible to absorb the stress loading to the pin 301 by the deformation of the pin 301 itself, and reduce the absorb loading to the connection between the pin 301 and the resin substrate or to the main body of the resin substrate. Therefore, if producing the pin standing resin substrate by using pins 301 produced by this method, this pin standing resin substrate is difficult to be destroyed, even if the pin receives stress, and it has high reliability.

In particular, in the present embodiment, the heat treatment was operated after the burr removal or the chamfer of the pin 301 in the barrel polishing step. Therefore, although the work hardening occurred in the pin by the barrel polishing, a residual stress was removed by the heat treatment and the pin was softened, so that influences by the barrel polishing could be nullified. Accordingly, the present embodiment where the barrel polishing is performed after the heat treatment is more preferable than the case where the softened pin 1 is again hardened by the barrel polishing.

Further, for preventing oxidation, the pin 301 is then formed on the surface with Ni plate of around 3 $\mu$m in thickness and Au plate of around 0.04 μm or more in thickness thereon (in the embodiment, around 0.35 μm). Thus, the above mentioned pin is accomplished.

Figure 5A:
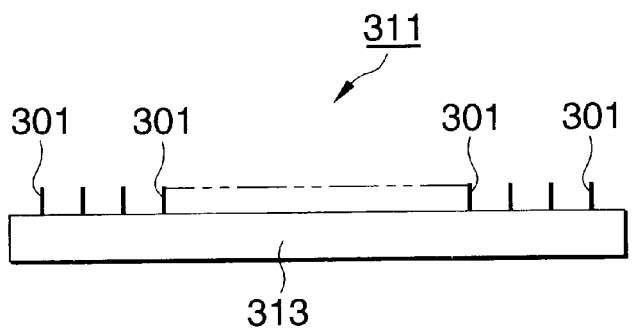
FIGS. 5A and 5B each is a view showing the pin standing resin substrate of the embodiment, where
Figure 5B:
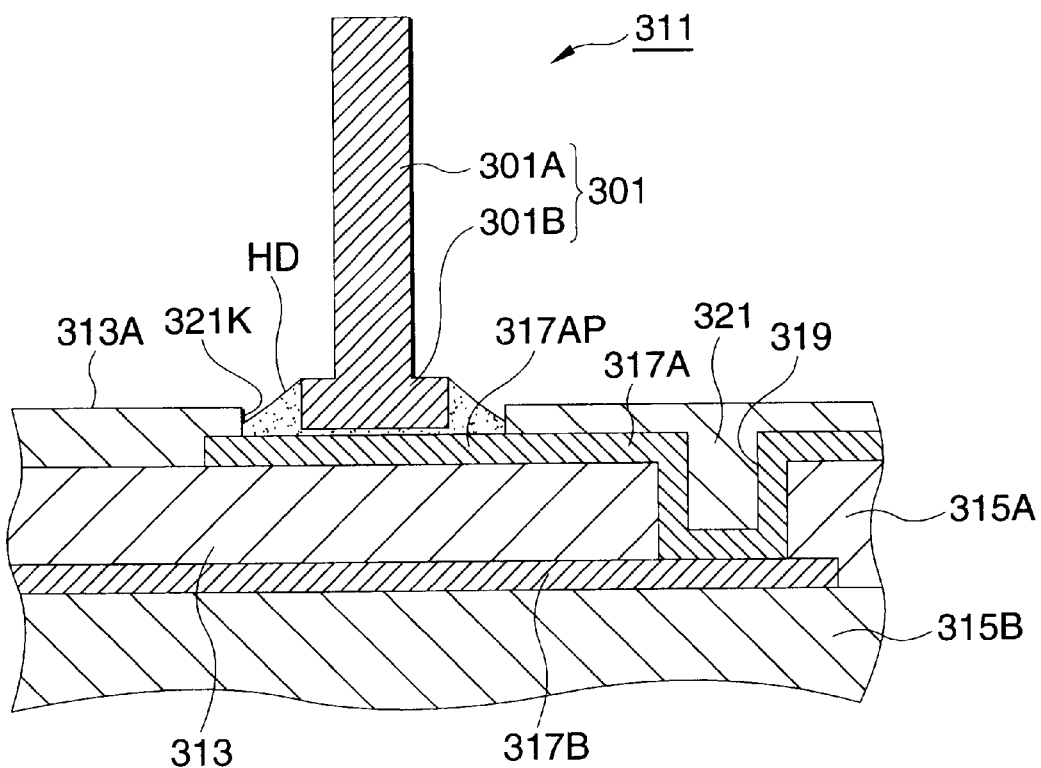

The pin standing resin substrate 311 of this embodiment will be explained referring to FIG. 5. FIG. 5A shows the side view of the pin standing resin substrate, and FIG. 5B shows a partially enlarged cross sectional view thereof.

This pin standing resin substrate 311 comprises a resin substrate 313 of substantially rectangular plate and many standing pins 301.

Of them, the resin substrate 313 is a resin multi layer wiring substrate where a plurality resin insulating layers 315A, 315B of epoxy resin are laminated, and a solder resist layer 321 is laminated thereon.

Between the resin insulating layers 315A and 315B, and between the resin insulating layer 315A and the solder resist layer 321, conductive layers 317A, 317B of wiring or pads are formed, respectively. In the resin insulating layers 315A, 315B, for connecting the conductive layers 317A, 317B, bear conductors 319 or through hole conductors (not shown) are many formed.

In the solder resist layer 321 forming a main face 313A of the resin substrate 313, many openings 321K of 1.03 mm diameter are formed in predetermined places. Within the opening 321K, exposed is a pin-pad 317AP of the conductor layer 317A formed between the resin insulating layer 315A and the solder resist layer 321. Accordingly, the diameter of the exposed portion of the pin-pad 317 is 1.03 mm in the present embodiment.

The pin 301 directs the enlarged diameter portion 301B to the pin-pad 317A, and is secured to the resin substrate 313 by soldering (HD) the end (the lower face in FIG. 5B) of the enlarged diameter portion 301B and the side thereof to the pin-pad 317AP. On the face (the upper face in the same) corresponding the rod-like portion in the enlarged diameter portion 301, the solder HD is not wet nor spread, otherwise somewhat wet and spread.

In this pin standing resin substrate 311, since the pin 301 is heat-treated at high temperatures and the hardness is lowered to the Vickers hardness Hv=around 150, the pin is softer than such a pin 301 which is not heat-treated, that is, the hardness is Hv=around 250 by the work hardening. Therefore, if the pin 301 receives the stress, since the pin 301 itself is deformed, so that it is possible to lighten stress effected to the connected portion between the pin 301 and the pin-pad 317AP and to the resin substrate itself, and prevent breakage at these portions. Therefore, this pin standing resin substrate 311 is difficult to be destroyed, even if the pin 301 receives stress, and it is high in reliability.

Next reference will be made to heat treating temperatures for the kovar made pin 301, the hardness of the pin 301 (the Vickers hardness Hv) and the relation with the bonding strength between the pin 301 and the resin substrate 313.

The following investigations were carried out for studying the Vickers hardness Hv of the pins 301 heat-treated at different temperatures and differences in the bonding strength between the pin 301—the resin substrate 313.

At first, the pins 301 were formed through the known procedure as mentioned above and the surface smoothening treatments by the barrel polishing and the chemical etching, turning out many pins comprising the kovar.

Figure 4:
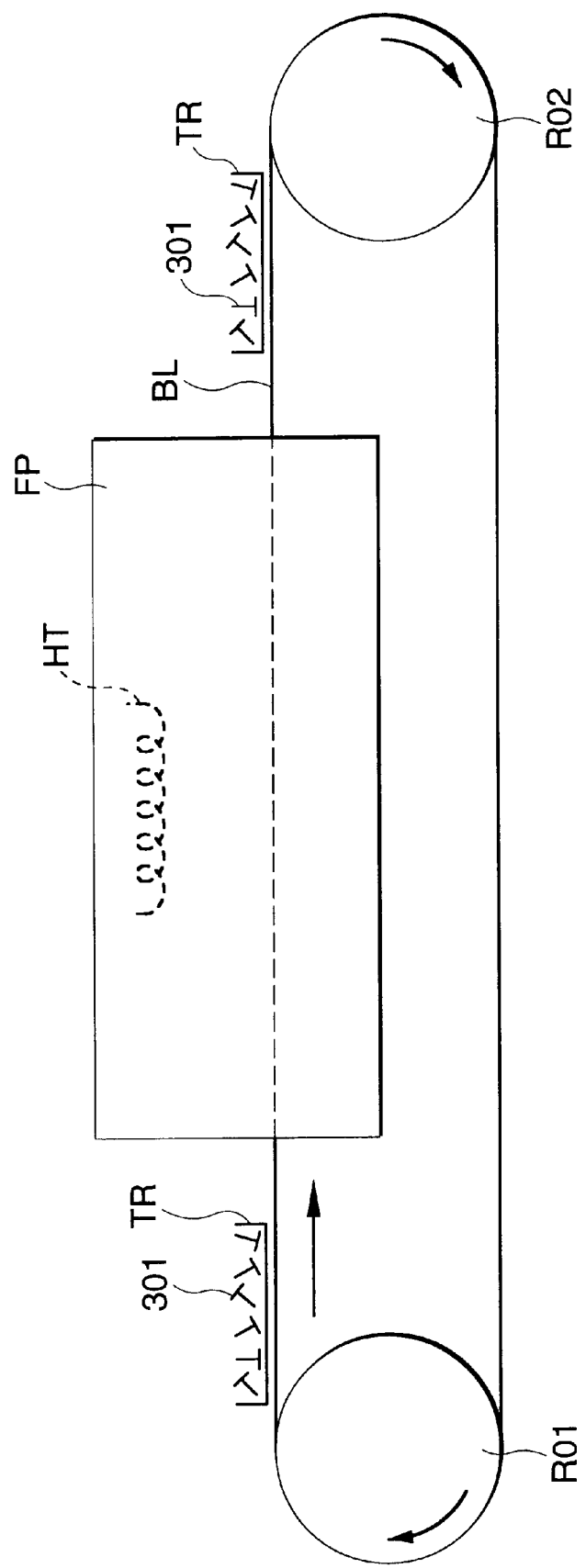
FIG. 4 is a view for explaining a condition of heat-treating pins.

Next, the temperature profile in the belt furnace FP as shown in FIG. 4 was changed, and at the same time the sending speed of the belt BL was selected from 300 mm/min and 150 mm/min, and in the pin heat-treating step, the pins 301 were heated at the respective maximum temperatures of 350, 382, 582, 593, 795, 940 and 945° C. other than the above mentioned maximum 792° C., and were slowly cooled. One kind of the pins which were not heat-treated and maintained at the room temperature were added to thus prepare nine kinds of the pins different in the heat-treating temperatures. With respect to these nine kinds of pins 301 (five pieces per one kind), the Vickers hardness Hv was measured at the front end 301AT of the rod-like portion 301A (see FIG. 1) by means of a micro Vickers measuring apparatus (MVK-E2 made by AKASHI Co., Ltd.). Results are shown in Table 1, and FIG. 6 shows the relationship between the maximum heat treating temperatures and the average values of the Vickers hardness.

TABLE 1

Vickers Hardness Hv

| Maximum Temperature (° C.) | Room Temp. | 350 | 382 | 582 | 593 |
|---|---|---|---|---|---|
| | | | | | n = 5 pcs. |
| Speed (mm/min) | — | 300 | 150 | 300 | 150 |
| Average Value | 247.6 | 259.2 | 260.4 | 258.0 | 256.0 |
| Maximum Value | 263 | 273 | 284 | 273 | 279 |
| Minimum Value | 217 | 241 | 237 | 248 | 223 |
| Deviation from Standard | 18.43 | 12.97 | 18.01 | 10.02 | 21.11 |

| Maximum Temperature (° C.) | 795 | 792 | 940 | 945 |
|---|---|---|---|---|
| Speed (mm/min) | 300 | 150 | 300 | 150 |
| Average Value | 146.6 | 147.6 | 147.0 | 147.8 |
| Maximum Value | 162 | 154 | 157 | 153 |
| Minimum Value | 135 | 133 | 139 | 143 |
| Deviation from Standard | 10.97 | 8.96 | 7.07 | 3.96 |

As apparently from Table 1 and FIG. 6, as to the kovar pins 301, in the case of not heat-treating but at the room temperature and in the case of the maximum heat-treating temperature below 593° C., each of the pins shows the high Vickers hardness Hv of around 250 in the average value, in short, each of them is under the hard condition. On the other hand, if the heat-treating temperature is heightened exceedingly 593° C., irrespective of the belt speed, the Vickers hardness Hv is rapidly lowered, and the pins which were heat-treated at the temperatures of higher than 600° C., in particular higher than 700° C., actually 795, 792, 940 or 945° C., were all lower than 200 of the Vickers hardness Hv, concretely lower than 170 in the maximum value and lower than 150 in the average value. It is seen that the pin was softened by the heat-treatment, and considered that the internal structure of the pin 301 was changed and softened by the heat treatment.

Thereafter, each kind of pins 301 were formed on the surfaces with plated layers of Ni (2.7 to 3.31 μm) and Au (0.28 to 0.39 μm). Being different depending on thickness of the plated layers, the formation of the Ni—Au plated layers causes the Vickers hardness Hv to go up by around 10 to 20. But, taking the increase of hardness by the plating into consideration, the decrease of hardness by the heat treatment apparently occurs.

The resin substrates 313 were soldered with the pins 310 to produce the pin standing resin substrates 311. Three sheets of the pin standing resin substrates 311 were produced per the same heat treating condition, that is, 9×3=27 sheets of the pin standing resin substrates were produced.

As to each of the pin standing resin substrates 311, the tensile test of a 30 degree obliquity was made to the pins 301. Actually, any of many pins of the pin standing resin substrate 311 was held and pulled in the direction of 30 degree obliquity with respect to the axis of the pin 301, that is, in the direction oblique at 30 degree with respect to a direction traversing the main face 313A of the resin substrate 313.

The tests were performed on ten pieces of pins 301 in each of the pin standing resin substrate 311 for measuring strength when the pin was broken or the connection between the pin and the resin substrate was broken. Accordingly, for the pins heat-treated at the same temperature, 30 pieces were tested in total.

These results are shown in Table 2, and FIG. 7 shows changes of the average values in the tensile strength.

TABLE 2

Tensile Strength (N) at 30° Obliquity n = 30 pcs.

| Maximum Temperature (° C.) | Room Temp. | 350 | 382 | 582 | 593 |
|---|---|---|---|---|---|
| Speed (mm/min) | — | 300 | 150 | 300 | 150 |
| Average Value (N) | 23.6 | 23.9 | 23.0 | 22.9 | 22.6 |
| Maximum Value (N) | 32.9 | 34.5 | 38.4 | 42.0 | 35.7 |
| Minimum Value (N) | 12.3 | 14.0 | 13.8 | 14.1 | 16.7 |
| Deviation from Standard (N) | 5.30 | 4.34 | 5.77 | 5.50 | 4.84 |
| Maximum Temperature (° C.) | | 795 | 792 | 940 | 945 |
| Speed (mm/min) | | 300 | 150 | 300 | 150 |
| Average Value (N) | | 27.9 | 29.0 | 32.2 | 33.9 |
| Maximum Value (N) | | 37.9 | 38.9 | 40.3 | 40.7 |
| Minimum Value (N) | | 23.2 | 22.8 | 24.5 | 26.7 |
| Deviation from Standard (N) | | 2.89 | 4.00 | 4.12 | 4.11 |

As apparently from Table 2 and FIG. 7, as to the kovar pins 301 of the present embodiment, in the case of not heat-treating but at the room temperature and in the case of the maximum heat-treating temperature below 593° C., each of the pins shows the low tensile strength. On the other hand, if the heat-treating temperature is heightened, irrespective of the belt speed, the tensile strength in each of them is seen to improve more than 25.5 N or more in the average values in the pins which are heat-treated at the temperatures of higher than 600° C., in particular higher than 700° C., actually 795, 792, 940 or 945° C.

As one of references for judging the tensile strength of the pins 301, it is requested that the tensile strength is at least 22.2 N (=2.27 kgf). For this request, in case the maximum temperature is lower than 600° C., the minimum value is around 12 to 14 N, and it is seen that some of the pins not meeting the request are included. On the other hand, the pins heat treated at the maximum temperature of 600° C. or higher, actually 795, 792, all exceed 22.2 N, and any of them satisfy the request (standard).

The pins heat-treated at the maximum temperature of 900° C. or higher, actually 940 or 945° C., have the tensile strength 30 N or higher in the average value, and especially high tensile strength as 24 N or higher in the minimum value, so that the pin standing resin substrate 311 of higher reliability is available.

From the results of the tension test of the above 30 degree obliquity, it is seen that the heating treatment at the maximum temperature of 600° C. or higher is good, and from the fact that the higher the maximum temperature, the more improved the tensile strength, it is seen that the maximum temperature at 700° C. or higher is more preferable. In particular, if the maximum temperature is 900° C. or higher, it is seen that the tensile strength may be 30 N or more in average value. On the other hand, the upper limit of the maximum temperature should be lower than 450° C. of the melting point of the kovar. The heat treatment at high temperatures requires correspondingly responsible facilities or cost, and therefore temperatures as low as possible are desirable, and the heat treatments at 1100° C. or lower, further 1000° C. or lower are desirable.

Figure 8:
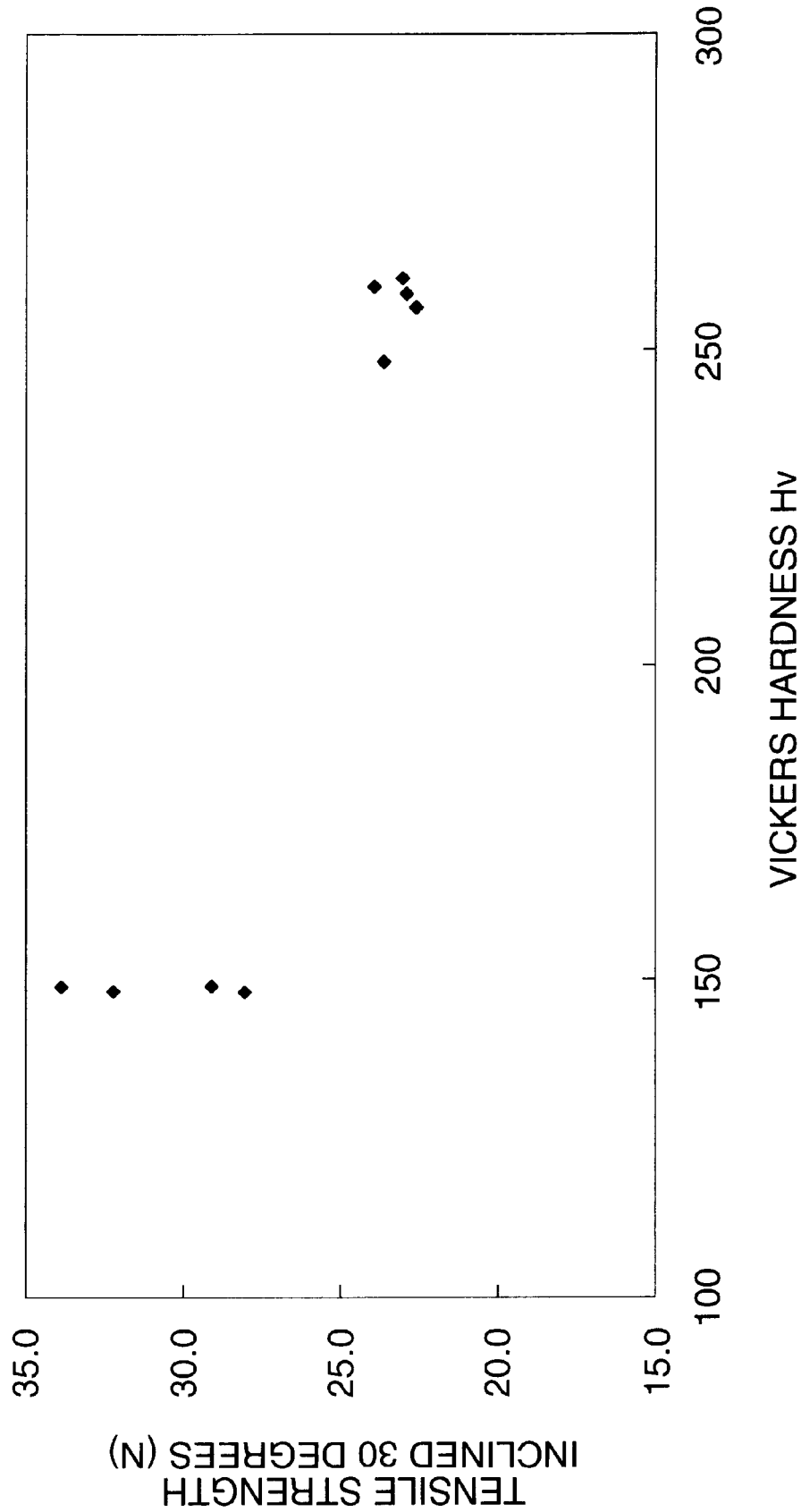
FIG. 8 is a graph showing the relationship between Vickers hardness Hv of kovar-made pins and the average value of the tensile strength with respect to the pin standing resin substrate under the tension test of the 30 degree obliquity.

The graph of FIG. 8 shows the relationship between the Vickers hardness of the pin (the average value) and the tensile strength at 30 degree obliquity (the average value). As apparently from the graph showing dispersions, it is seen that with respect to the pin standing resin substrate soldered with soft pins 301 of the Vickers hardness Hv being 200 or less, Hv≦170, specifically Hv=around 150 in the average value, the tensile strength is improved 25.5 N or more in the average value. Accordingly, as in the present embodiment, not limiting to the heat-treated pins, if using such pins of the Vickers hardness Hv being 200 or less, more preferably Hv≦170, it is seen that the bonding strength between the pin and the resin substrate is increased and the reliability of the pin standing resin substrate 311 is heightened.

As to the comparative embodiments soldering pins of the same kovar performed with the similarly heating treatment and different only in size (the rod-like portion: ø0.3×1.87, the enlarged diameter portion: ø0.60×0.13, and the full length: 2.0) to the resin substrate 313, the same tension tests of 30 degree obliquity were carried out on the pin standing resin substrate. Results are shown in Table 3. The pin used in the comparative embodiment is, in comparison with the pin 301 of the above mentioned embodiment, different in smaller diameter of the enlarged diameter portion (0.65→0.60) and in smaller thickness (0.20→0.13).

TABLE 3

Tensile Strength (N) at 30° Obliquity n = 20 pcs.

| Maximum Temperature (° C.) | Room Temp. | 350 | 382 | 582 | 593 |
|---|---|---|---|---|---|
| Speed (mm/min) | — | 300 | 150 | 300 | 150 |
| Average Value (N) | 19.5 | 22.0 | 20.8 | 19.5 | 20.0 |
| Maximum Value (N) | 30.0 | 29.7 | 31.7 | 24.9 | 26.1 |
| Minimum Value (N) | 15.7 | 16.0 | 14.6 | 13.6 | 15.4 |
| Deviation from Standard (N) | 4.06 | 3.85 | 3.69 | 2.86 | 2.89 |
| Maximum Temperature (° C.) | | 795 | 792 | 940 | 945 |
| Speed (mm/mm) | | 300 | 150 | 300 | 150 |
| Average Value (N) | | 20.8 | 21.0 | 21.0 | 22.7 |
| Maximum Value (N) | | 26.0 | 27.9 | 28.7 | 34.4 |
| Minimum Value (N) | | 18.0 | 16.2 | 15.0 | 17.1 |
| Deviation from Standard (N) | | 2.56 | 3.28 | 3.04 | 4.51 |

As is apparently from Table 3, the pin standing resin substrates of the comparative embodiment show different results from those of the pins 301 of the present embodiment. In any of pins heat-treated including those treated at 795, 792, 940 and 945° C., the tensile strength of 30 degree obliquity is low, and it is seen that satisfied are neither the request to be 25.5 N in the average value as the reference for judging the tensile strength of the pin 301, nor the request to be the minimum 22.2 N. Namely, in case of using the pins of this size, even if the heat treatment is performed and the Vickers hardness is brought down, it is not possible to satisfy the request of 25.5 N or more in the average value as the reference for heightening the tensile strength, and the request of the minimum 22.2 N or more.

Although it is considered that there exists the effect of lowering the pin hardness by the heat treatment, influences by the smaller size than that of the pin 301 of the present embodiment (the diameter and thickness of the enlarged diameter portion) are large, and the effect of lowering the pin hardness is not actualized in the comparative embodiment. Further, it is seen that there is a range of the pin size of bringing about the effect of lowering the pin hardness and heightening the tensile strength. That is, in pin of the small size to this degree, it is seen that a contribution of the influence by changing the shape (size) is larger than a contribution of the influence by lowering the pin hardness through the heat treatment, and the effect of lowering the pin hardness is actualized.

Thereupon, as to the pins which were not heat-treated and whose enlarged diameter portions were changed in diameter and thickness as well as the pins which were heat-treated under the conditions of the belt speed being 150 mm/min and the maximum temperature being 792° C., the tensile strength of the 30 degree obliquity was similarly measured. The average values of the tensile strength are shown in Table 4.

TABLE 4

| | Tensile Strength (N) at 30° Obliquity Average Value | | | |
| --- | --- | --- | --- | --- |
| | | | | n = 30 pcs. |
| | Diameter of Enlarged diameter portion (mm) | 0.60 | 0.65 | 0.70 |
| Thickness of Enlarged diameter portion | 0.13 (mm): No Heating Treatment | 19.5 | — | — |
| | 0.13 (mm): Heating Treatment | 21.0 | — | — |
| | 0.15 (mm): No Heating Treatment | 20.9 | 23.0 | 24.5 |
| | 0.15 (mm): Heating Treatment | 25.7 | 27.4 | 31.5 |
| | 0.20 (mm): No Heating Treatment | 22.1 | 23.6 | 25.3 |
| | 0.20 (mm): Heating Treatment | 27.0 | 29.0 | 33.9 |

As apparently from Table 4, it is seen that the tensile strength is heightened in each of the heat-treated pins in comparison with the not heat-treated pins. Particularly, it is remarkably heightened in the ranges of the diameter of the enlarged diameter portion being 0.6 to 0.7 mm and the thickness being 0.15 to 0.20 mm, and in these ranges, each of the average values of the tensile strength is above 25.5 N.

Although not shown in Table 4, when using five kinds of the heat-treated pins of the diameter (mm) and thickness (mm) of 0.60×0.20; 0.65×0.15; 0.65×0.20; 0.70×0.15; and 0.70×0.20, each of the maximum values of the tensile strength was 22.2 N or more. That is, it is seen that the pins of the diameter being 0.60 mm and the thickness being 0.20 mm, and the pins of the diameter being 0.65 to 0.70 mm and the thickness being 0.15 to 0.20 mm, could satisfy the request of the minimum value being 22.2 N.

The investigations were also practiced on the pins 301 of the 42 alloy (42Ni—Fe) with almost the same results.

Figure 9A:
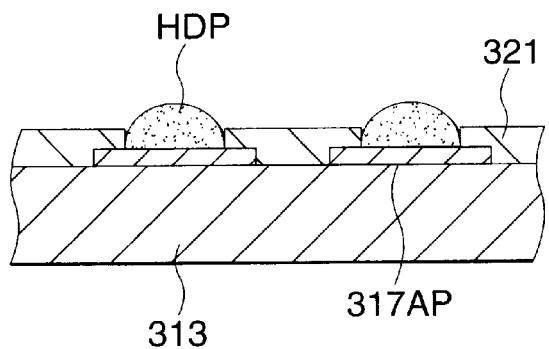
FIGS. 9A to 9C each is a view showing pins fixing processes in the method of making the pin standing resin substrate according to the embodiments, where

Further explanation will be made to a method of making the pin standing resin substrate 311, referring to FIG. 9.

Firstly, such pins 301 are prepared which have the rod-like portions 301A and the enlarged diameter portion 301B, and have been heat-treated to bring down the hardness. Practically, as mentioned above, passing through the holding, pressing, and cutting steps, and further the barrel polishing step and the surface smoothening treatment by chemically etching, the pins 301 are formed from the kovar wire material MT, and the hardness of pins is lowered by the heat-treatment in the pin heat-treating step (the lowering step of hardness of the pin).

Thereafter, for preventing oxidation of the pin 301, the Ni plate and Au plate are carried out on the pin surface.

Next, the above mentioned resin substrate 313 is separately prepared. The resin substrate 313 is alternately formed with the resin insulating layer 315 and the conductive layer 317 by a known procedure, and further formed with the solder resist layer 321.

After that, the pins 301 are fixed to the resin substrate 313. Actually, in a solder-printing step, soldering pastes HDP (Sn95%-Sb5%, melting point: 235 to 240° C.) are printed respectively on the pin-pad 317AP of the resin substrate 313 as shown in FIG. 9A.

Figure 9B:
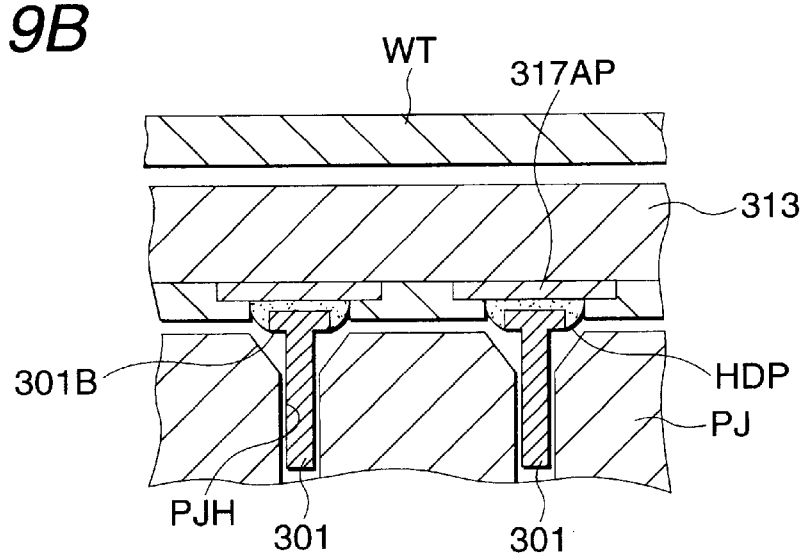
Figure 9C:
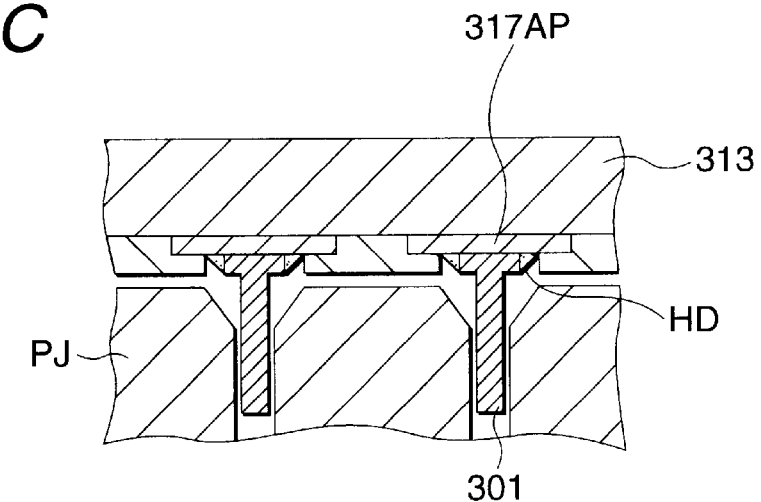
Figure 10:
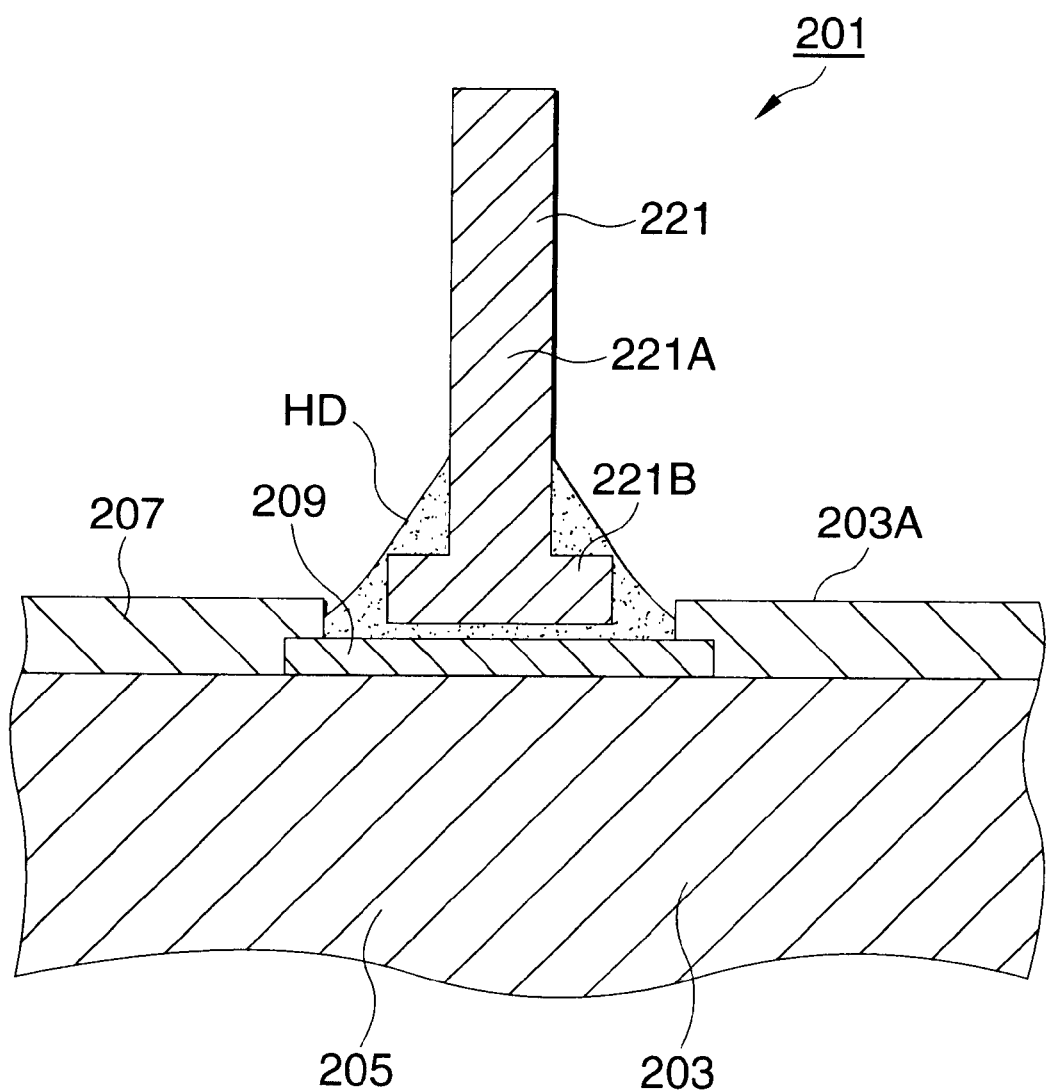
FIG. 10 is a partially enlarged cross sectional view showing the pin standing resin substrate according to the related art.

Then, in the mounting step, the pins 301 are set in pin-insertion holes PJH formed in a pin standing jig PJ as shown in FIG. 9B, on which the resin substrate 313 printed with the solder paste HDP is mounted by alignment, so that the enlarged diameter portion 301B of the pin 301 is contacted to the solder paste HDP on the pin-pad 317AP, and a weight is put thereon to press the resin substrate 313.

In a re-flow step, the resin substrate 313 mounted on the pin standing jig PJ is carried into a re-flow furnace, heated at the maximum 260° C. to melt the soldering paste HDP, and if soldering the enlarged diameter portion 301B of the pin 301 to the pin-pad 317AP, the pin standing resin substrate 311 is completed.

In this production, as the pin 301 is previously heated and the hardness is lowered, it is softer than the not heat treated pin. Therefore, in the produced pin standing resin substrate 311, the pin 301 itself absorbs the stress occurring between the pin 301 and the pin-pad 317AP (the resin substrate 313) or the stress loaded on the pin 301 from the outside, and it is possible to lighten the stress at the connection between the pin 301 and the resin substrate 313 or the resin substrate 313 itself.

Thus, according to this production, the pin standing resin substrate 311 less in destruction and high in reliability can be produced even if the stress is loaded on the pin 301.

Particular, in this pin standing resin substrate 311, the heat treated pins 301 are soldered after removing burrs or chamfering in the barrel polishing step. In short, differently from the case of carrying out the barrel polishing after the heat treatment, the effect of the heat treatment can be fully displayed, and enough softened pins 301 are employed, and therefore the pin standing resin substrate 311 less in destruction and high in reliability can be produced even if the stress is loaded on the pin 301.

In the above discussion, the invention has been explained in line with the embodiments, and of course the invention is not limited to the above embodiments, and appropriately modified applications are available so far as being not off from the inventive subject matter.

For example, the pin of so-called nail head has been used in the above embodiments, but the enlarged diameter portion may be shaped into, e.g., a portion of substantially disk shape formed at the front end of the rod-like portion with e.g., a substantially semi-sphere comprising Ag soldering material expanding from the disk portion in opposition to the rod-like portion.

In the above mentioned embodiments, Sn/Sn-solder has been used as the solder HD, but Pb/Sn- and Sn/Ag-solders maybe served.

The entire disclosure of each and every foreign patent application from which the benefit of foreign priority has been claimed in the present application is incorporated herein by reference, as if fully set forth.

What is claimed is:

1. A pin standing resin substrate, which comprises:
   a resin substrate having a substantially plate-shaped main surface, comprising one of a resin and a composite material containing a resin, and having a pin-pad whose diameter of a portion exposed from the main surface is 0.9 to 1.1 mm; and
   a pin solder-jointed to the pin-pad,
   wherein the pin comprises: a rod-like portion comprising one of kovar and 42 alloy; and an enlarged diameter portion having the same material as the rod-like portion, the enlarged diameter portion having a larger diameter than the rod-like portion, having a diameter of 0.60 to 0.70 mm and a thickness of 0.15 to 0.20 mm, and being formed at one end of the rod-like portion,
   the pin has a Vickers hardness Hv of 200 or less, and at least the enlarged diameter portion is soldered to the pin-pad.

2. A pin standing resin substrate, which comprises:
   a resin substrate having a substantially plate-shaped main surface, comprising one of a resin and a composite material containing a resin, and having a pin-pad whose diameter of a portion exposed from the main surface is 0.9 to 1.1 mm; and
   a pin solder-jointed to the pin-pad,
   wherein the pin has been subjected to heat treatment at 700° C. or higher, and comprises: a rod-like portion comprising one of a kovar and a 42 alloy; and an enlarged diameter portion having the same material as the rod-like portion, the enlarged diameter portion having a larger diameter than the rod-like portion, having a diameter of 0.60 to 0.70 mm and a thickness of 0.15 to 0.20 mm, and being formed at one end of the rod-like portion, and
   at least the enlarged diameter portion is soldered to the pin-pad.

3. The pin standing resin substrate as set forth in claim 1, wherein the enlarged diameter portion of the pin has a diameter of 0.65 to 0.70 mm.

4. The pin standing resin substrate as set forth in claim 2, wherein the enlarged diameter portion of the pin has a diameter of 0.65 to 0.70 mm.

5. A pin for use in a pin standing substrate having at least one pin as an input/output terminal standing thereon, which comprises:
   a rod-like portion comprising one of a kovar and a 42 alloy; and
   an enlarged diameter portion which has the same material as the rod-like portion, has a larger diameter than the rod-like portion, is formed at one end of the rod-like portion, has a diameter of 0.60 to 0.70 mm and a thickness of 0.15 to 0.20 mm,
   wherein the pin has a Vickers hardness Hv of not more than 200.

6. A pin for use in a pin standing substrate having at least one pin as an input/output terminal standing thereon, which comprises:
   a rod-like portion comprising one of a kovar and a 42 alloy; and
   an enlarged diameter portion which has the same material as the rod-like portion, has a larger diameter than the rod-like portion, is formed at one end of the rod-like portion, has a diameter of 0.60 to 0.70 mm and a thickness of 0.15 to 0.20 mm,
   wherein the pin has been subjected to heat treatment at 700° C. or higher.

* * * * *